United States Patent
Zope et al.

(10) Patent No.: US 9,637,819 B2
(45) Date of Patent: May 2, 2017

(54) METHODS FOR PREFERENTIAL GROWTH OF COBALT WITHIN SUBSTRATE FEATURES

(71) Applicant: APPLIED MATERIALS, INC., Santa Clara, CA (US)

(72) Inventors: Bhushan N. Zope, Santa Clara, CA (US); Avgerinos V. Gelatos, Redwood City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 47 days.

(21) Appl. No.: 14/543,064

(22) Filed: Nov. 17, 2014

(65) Prior Publication Data

US 2015/0140233 A1  May 21, 2015

Related U.S. Application Data

(60) Provisional application No. 61/905,647, filed on Nov. 18, 2013.

(51) Int. Cl.
   *H05H 1/24* (2006.01)
   *C23C 16/06* (2006.01)
   (Continued)

(52) U.S. Cl.
   CPC .......... *C23C 16/045* (2013.01); *C23C 14/046* (2013.01); *C23C 16/0281* (2013.01);
   (Continued)

(58) Field of Classification Search
   CPC ... C23C 14/024; C23C 14/025; C23C 14/046; C23C 14/14–14/205; C23C 16/0272;
   (Continued)

(56) References Cited

U.S. PATENT DOCUMENTS 6,096,644 A * 8/2000 Lukanc ............ H01L 21/28518
                                                           257/E21.165
6,245,655 B1 * 6/2001 Moslehi ............ H01L 21/76879
                                                           257/E21.586
(Continued)

OTHER PUBLICATIONS

Webster's Ninth New Collegiate Dictionary; Merriam-Webster incorporated, publishers; Springfield, Massachusetts, USA; 1990 (no month); excerpt p. 622.*

(Continued)

*Primary Examiner* — Marianne L Padgett
(74) *Attorney, Agent, or Firm* — Moser Taboada; Alan Taboada

(57) ABSTRACT

Methods for depositing cobalt in features of a substrate include providing a substrate to a process chamber, the substrate having a first surface, a feature formed in the first surface comprising an opening defined by one or more sidewalls, a bottom surface, and upper corners, and the substrate having a first layer formed atop the first surface and the opening, wherein a thickness of the first layer is greater proximate the upper corners of the opening than at the sidewalls and bottom of the opening; exposing the substrate to a plasma formed from a silicon-containing gas to deposit a silicon layer predominantly onto a portion of the first layer atop the first surface of the substrate; and depositing a cobalt layer atop the substrate to fill the opening, wherein the silicon layer inhibits deposition of cobalt on the portion of the first layer atop the first surface of the substrate.

11 Claims, 3 Drawing Sheets

(51) Int. Cl.
*C23C 16/04* (2006.01)
*C23C 16/24* (2006.01)
*C23C 16/02* (2006.01)
*C23C 16/50* (2006.01)
*C23C 14/04* (2006.01)

(52) U.S. Cl.
CPC .............. *C23C 16/06* (2013.01); *C23C 16/24* (2013.01); *C23C 16/50* (2013.01)

(58) Field of Classification Search
CPC ... C23C 16/0281; C23C 16/045; C23C 16/08; C23C 16/14; C23C 16/16; C23C 16/18; C23C 16/24; C23C 16/45536–16/45542; C23C 16/50–16/517
USPC ..... 427/524, 526, 527, 535, 578, 97.3, 97.4, 427/97.6, 97.8, 98.2, 98.5
See application file for complete search history.

(56) References Cited

U.S. PATENT DOCUMENTS

| | | | |
|---|---|---|---|
| 6,559,026 B1* | 5/2003 | Rossman | C23C 16/045 257/E21.279 |
| 7,510,634 B1* | 3/2009 | Klawuhn | C23C 14/046 204/192.17 |
| 7,964,504 B1* | 6/2011 | Shaviv | C23C 14/046 257/E21.17 |
| 8,476,162 B2 | 7/2013 | Ha et al. | |
| 8,637,390 B2 | 1/2014 | Ganguli et al. | |
| 9,349,637 B2* | 5/2016 | Na | H01J 37/32009 |
| 9,530,674 B2 | 12/2016 | Yieh | H01L 21/67017 |
| 2002/0029958 A1* | 3/2002 | Chiang | C23C 14/046 204/192.1 |
| 2002/0192396 A1* | 12/2002 | Wang | H01L 21/28518 427/574 |
| 2005/0280118 A1* | 12/2005 | Lin | H01L 21/28061 257/618 |
| 2006/0251801 A1* | 11/2006 | Weidman | B82Y 30/00 427/99.5 |
| 2006/0252252 A1* | 11/2006 | Zhu | B82Y 30/00 438/618 |
| 2007/0077683 A1* | 4/2007 | Cerio, Jr. | C23C 14/046 438/99 |
| 2012/0012465 A1 | 1/2012 | Kim et al. | |
| 2013/0273729 A1* | 10/2013 | Hempel | H01L 21/823807 438/592 |
| 2015/0203961 A1 | 7/2015 | Ha et al. | |
| 2015/0262828 A1 | 9/2015 | Brand et al. | |
| 2016/0035619 A1* | 2/2016 | Yu | H01L 21/76838 438/680 |
| 2016/0056074 A1* | 2/2016 | Na | H01J 37/32009 438/666 |
| 2016/0056077 A1* | 2/2016 | Lai | H01J 37/32449 438/653 |
| 2016/0104639 A1* | 4/2016 | Zope | C23C 14/22 257/751 |
| 2016/0322255 A1* | 11/2016 | Chiang | C23C 14/046 |

OTHER PUBLICATIONS

R.J. Lewis, Sr., editor; Hawley's Condensed Chemical Dictionary, 12th edition; Van Nostrand Reinhold company, New York; 1993 (no month); excerpt p. 635.*
U.S. Appl. No. 14/802,275, filed Jul. 17, 2015, Trivedi et al.
U.S. Appl. No. 14/815,156, filed Jul. 31, 2015, Yu et al.
U.S. Appl. No. 14/931,417, filed Nov. 3, 2015, Ai et al.

* cited by examiner

METHODS FOR PREFERENTIAL GROWTH OF COBALT WITHIN SUBSTRATE FEATURES

CROSS-REFERENCE TO RELATED APPLICATIONS

This application claims benefit of U.S. provisional patent application Ser. No. 61/905,647, filed Nov. 18, 2013, which is herein incorporated by reference in its entirety.

FIELD

Embodiments of the present disclosure generally relate to methods of depositing cobalt in features formed on a substrate.

BACKGROUND

The inventors have observed that chemical vapor deposition of cobalt can be used as a metal deposition technique for applications such as forming metal interconnects in an integrated circuit. This may be accomplished, for example, by growing metal films directly onto a dielectric layer, or alternatively, onto a barrier layer, such as titanium nitride (TiN). For a logic-contact fill application, a sputter clean process may be performed to remove oxide from a bottom of an interface, followed by physical vapor deposition of a titanium layer prior to a low-resistivity metal fill. However, the inventors have observed that using such a process for a cobalt fill may undesirably result in the deposition of a cobalt film with a void trapped inside the feature.

Accordingly, the inventors have developed improved techniques to deposit cobalt in features disposed in a substrate.

SUMMARY

Methods for depositing cobalt in features of a substrate are provided herein. In some embodiments, methods for depositing cobalt include providing a substrate to a process chamber, the substrate having a first surface, a feature formed in the first surface comprising an opening defined by one or more sidewalls, a bottom surface, and upper corners, and the substrate having a first layer formed atop the first surface and the opening, wherein a thickness of the first layer is greater proximate the upper corners of the opening than at the sidewalls and bottom of the opening; exposing the substrate to a plasma formed from a silicon-containing gas to deposit a silicon layer predominantly onto a portion of the first layer atop the first surface of the substrate; and depositing a cobalt layer atop the substrate to fill the opening, wherein the silicon layer inhibits deposition of cobalt on the portion of the first layer atop the first surface of the substrate.

In some embodiments, methods for depositing a cobalt layer in features of a substrate may include: providing a substrate to a process chamber, the substrate having a first surface, a feature formed in the first surface comprising an opening defined by one or more sidewalls, a bottom surface, and upper corners, and the substrate having a first layer formed atop the first surface and the opening, wherein a thickness of the first layer is greater proximate the upper corners of the opening than at the sidewalls and bottom of the opening; exposing the substrate to a plasma formed from a silicon-containing gas to deposit a silicon layer predominantly onto a portion of the first layer atop the first surface of the substrate, wherein the process chamber has a temperature of about 100 degrees Celsius to about 500 degrees Celsius and a pressure of about 0.5 Torr to about 50 Torr, and wherein the substrate is exposed to the plasma for about 5 seconds to about 200 seconds; applying a bias power to the substrate while exposing the first layer to the plasma and depositing a cobalt layer atop the substrate to fill the opening, wherein the silicon layer inhibits deposition of cobalt on the portion of the first layer atop the first surface of the substrate.

In some embodiments, a computer readable medium, having instructions stored thereon which, when executed, cause a process chamber to perform a method for depositing cobalt in features formed on a substrate. The method may include any of the embodiments disclosed herein Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
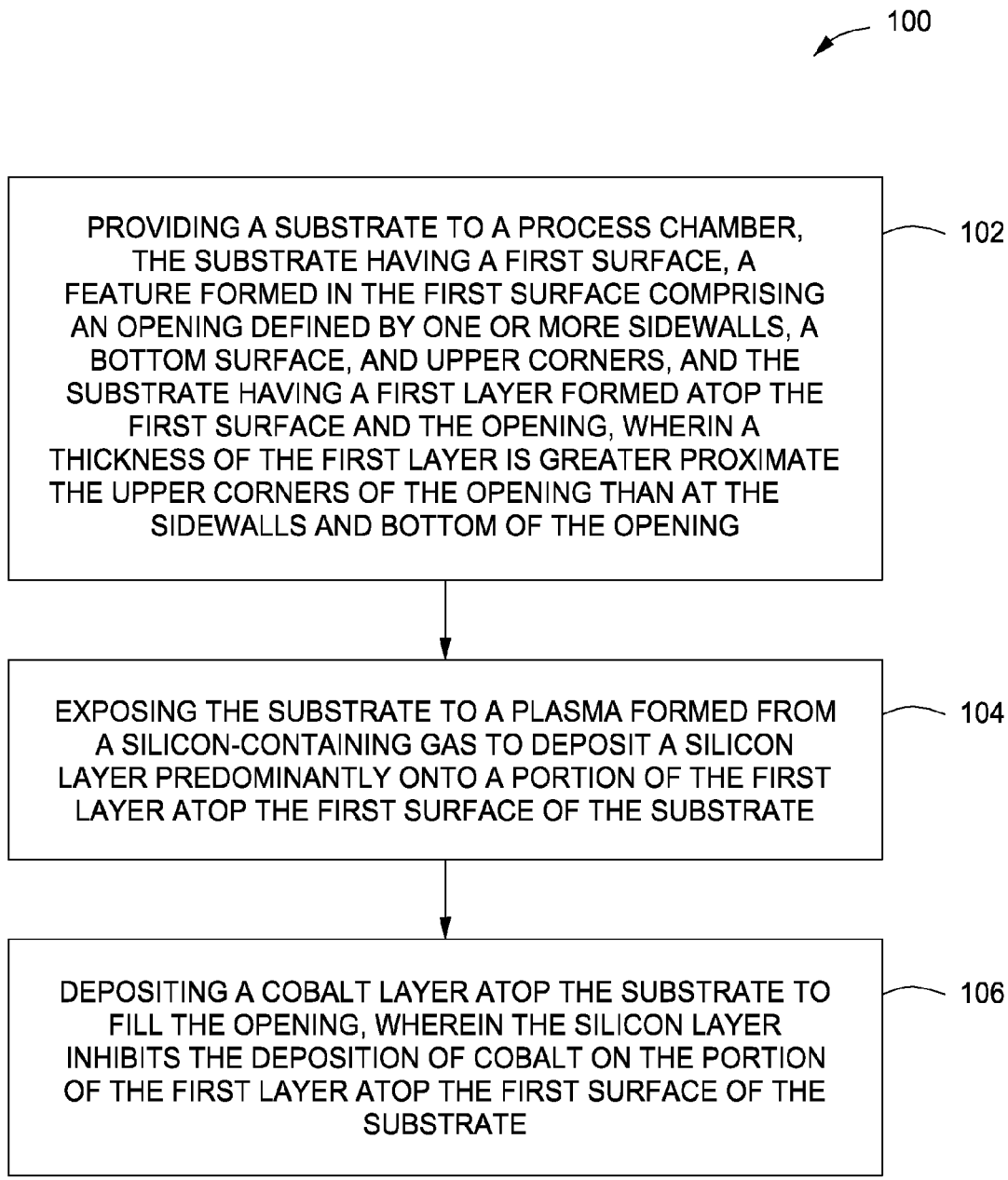
FIG. 1 depicts a flow chart of a method for depositing cobalt in features formed on a substrate in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for depositing cobalt in features formed on a substrate are provided herein. The inventive methods advantageously provide the preferential growth of a cobalt fill within features formed on a substrate without the formation of a void. The inventive methods may be utilized in the formation of metal interconnects in an integrated circuit, or in the formation of a metal gate or a metal-contact gap fill process, as well as other suitable applications where depositing a metal fill layer without a void in substrate features may be desired.

FIG. 1 depicts a flow chart of a method 100 for depositing cobalt in accordance with some embodiments of the present disclosure. The method 100 is described below with respect to the stages of filling a feature with cobalt as depicted in FIGS. 2A-2C and may be performed, for example, in a suitable reactor, such as is described below with respect to FIG. 3.

The method 100 begins at 102 by providing a substrate 200 to a process chamber, such as is described below with respect to FIG. 3. The substrate 200 may be any suitable substrate having a feature 204 formed therein. For example, the substrate 200 may comprise one or more of silicon (Si), silicon oxide (SiO$_2$), or the like. In addition, the substrate 200 may include additional layers of materials or may have one or more completed or partially completed structures formed therein or thereon.

Figure 2A:
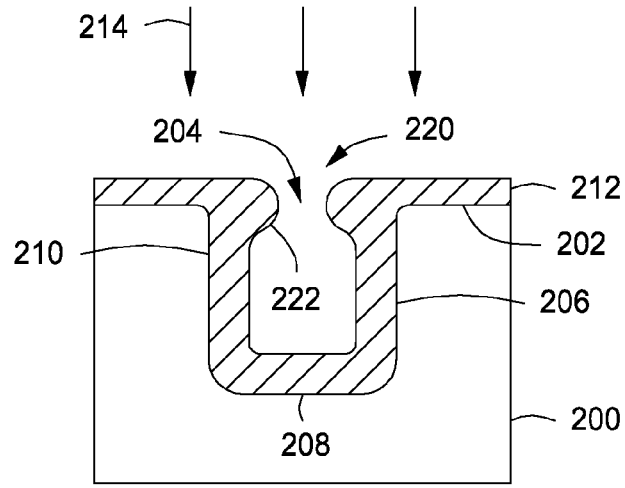
FIGS. 2A-C depicts the stages of filling a feature with cobalt in accordance with some embodiments of the present disclosure.
Figure 2B:
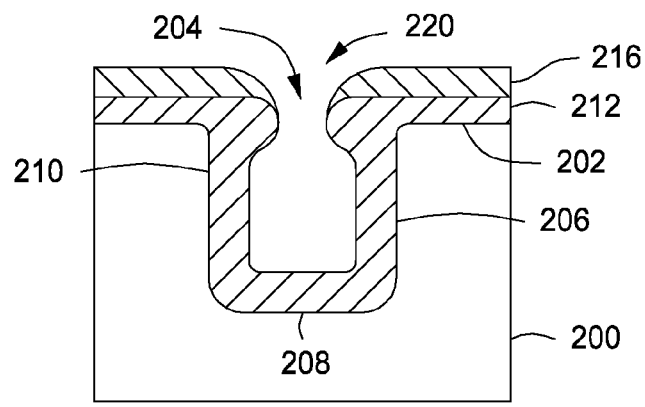
Figure 2C:
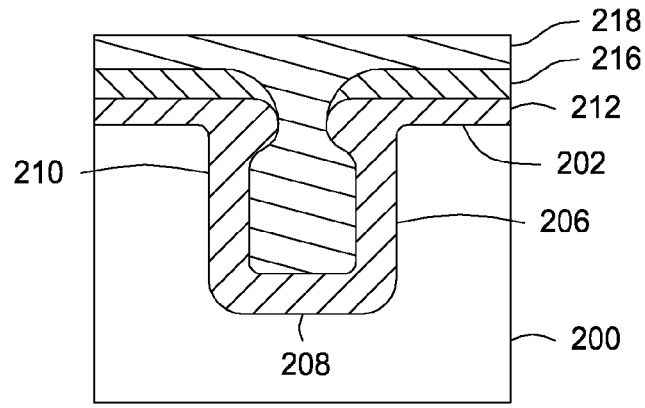

As depicted in FIG. 2A, the substrate 200 includes a first surface 202 having a feature 204 formed in the first surface of the substrate 200. The feature 204 comprises an opening 220 formed in the first surface 202 of the substrate 200 and extending into the substrate 200 towards an opposing second surface of the substrate 200.

The opening 220 may be any suitable opening such as a via, trench, dual damascene structure, or the like. In some embodiments, the feature 204 may have a height to width aspect ratio of about 3:1 to about 15:1. The opening 220 may be formed by etching the substrate 200 using any suitable etch process. The opening 220 is defined by one or more sidewalls 206, a bottom 208, and upper corners 210.

A first layer 212 is formed atop the first surface 202, the bottom 208, and the sidewalls 206 prior to depositing cobalt material as described at 106 below. In some embodiments, the thickness of the first layer 212 may be greater proximate the upper corners 210 of the opening 220 than at the sidewalls 206 and bottom 208 of the opening 220, to create an overhang 222. As a result of the overhang 222, the critical dimension at the opening 220 is smaller than at the middle and bottom of the feature 204.

In some embodiments, the first layer 212 may be an oxide material, such as silicon oxide (SiO$_2$) or the like. The oxide material may be deposited or grown by any suitable oxidation process using any suitable process chamber, for example a chemical vapor deposition (CVD) chamber or an oxidation chamber. The oxide material may serve as an electrical and/or physical barrier between the substrate and a metal-containing layer to be subsequently deposited in the opening, and/or may function as a better surface for attachment during the deposition process discussed below than a native surface of the substrate. In some embodiments, the first layer 212 may include a barrier material deposited atop the oxide layer. In some embodiments, an oxide layer is not present and the barrier material may be the first layer 212 formed atop the first surface 202, the bottom 208 and sidewalls 206 of the feature 204. The barrier material may serve a similar purpose as the oxide material discussed above. In some embodiments, the barrier material may include at least one of titanium (Ti), tantalum (Ta), and oxides or nitrides of Ti, Ta, or the like. The barrier material may be deposited by any suitable methods, such as by CVD or PVD.

Next at 104, the substrate 200 is exposed to a plasma 214 formed from a silicon containing gas. In some embodiments, the silicon-containing gas can be silane (SiH$_4$) or derivatives thereof (e.g., disilane, trisilane, tetrasilane, chlorosilane, dichlorosilane, tetrachlorosilane, hexachlorodisilane, methylsilane, or the like). The plasma process is conducted in any suitable process chamber having a plasma source, for example the process chamber depicted in FIG. 3.

In some embodiments, the plasma 214 is formed by providing about 10 watts to 1,000 watts of RF energy at a suitable frequency, such as about 2 MHz to about 60 MHz to the process chamber. In some embodiments, the process chamber may be maintained at a pressure of about 0.5 Torr to about 50 Torr during the plasma exposure process. The pressure in the chamber may be maintained by the flow rate of the silicon-containing gas and/or the flow rate of an additional gas, such as an inert gas, which may be co-flowed with the silicon-containing gas. In some embodiments, the temperature in the process chamber during the plasma exposure process is about 100 degrees Celsius to about 500 degrees Celsius, for example about 400 degrees Celsius to about 500 degrees Celsius. In some embodiments, the substrate is exposed to the plasma 214 for about 5 seconds to about 200 seconds.

The inventors have observed that capacitive plasma treatments are highly directional, which facilitates the direction of the silicon ions approximately perpendicular to the first surface 202. As a result, a silicon layer 216 is formed predominantly on a portion of the first layer 212 atop the first surface 202 of the substrate 200 and is not predominantly formed on the sidewalls or bottom of the feature 204. In some embodiments, the silicon layer 216 has a thickness of about 1 angstrom to about 25 angstroms. Thus, a capacitive plasma process will minimize the amount of silicon that is formed on the sidewalls 206 and bottom 208 of the feature 204. In some embodiments, a bias power (e.g., RF energy) can be applied to the substrate to control the directionality of the silicon ions.

Next at 106, a cobalt layer 218 is deposited atop the substrate 200 to fill the opening 220. The cobalt layer 218 may be deposited using any suitable metal deposition process, for example a CVD or PVD process. The inventors have observed that the presence of the silicon layer 216 formed in step 104 above inhibits the deposition of a cobalt layer 218 on the portion of the first layer 212 atop the first surface 202 of the substrate resulting in the deposition of the cobalt layer 218 occurring faster on the sidewalls 206 and bottom 208 of the opening 220 than on the first surface 202 (e.g., the top surface) of the first layer 212. The feature 204 is thus advantageously filled with cobalt without the formation of a void. For example, the inventors have observed that the presence of the silicon layer 216 delays the growth of the cobalt on the portion of the first layer 212 atop the first surface 202 of the substrate by about 20 seconds to about 30 seconds. Depending upon the deposition rate of cobalt, this can result in the deposition of about 10 angstroms to about 50 angstroms of cobalt inside the feature 204 before the growth of cobalt on the portion of the first layer 212 atop the first surface 202 of the substrate.

After the feature 204 is filled, the method 100 generally ends and the substrate 200 may proceed for further processing. In some embodiments, subsequent processes such as deposition, etch, annealing, or the like may be performed to fabricate a finished device.

Figure 3:
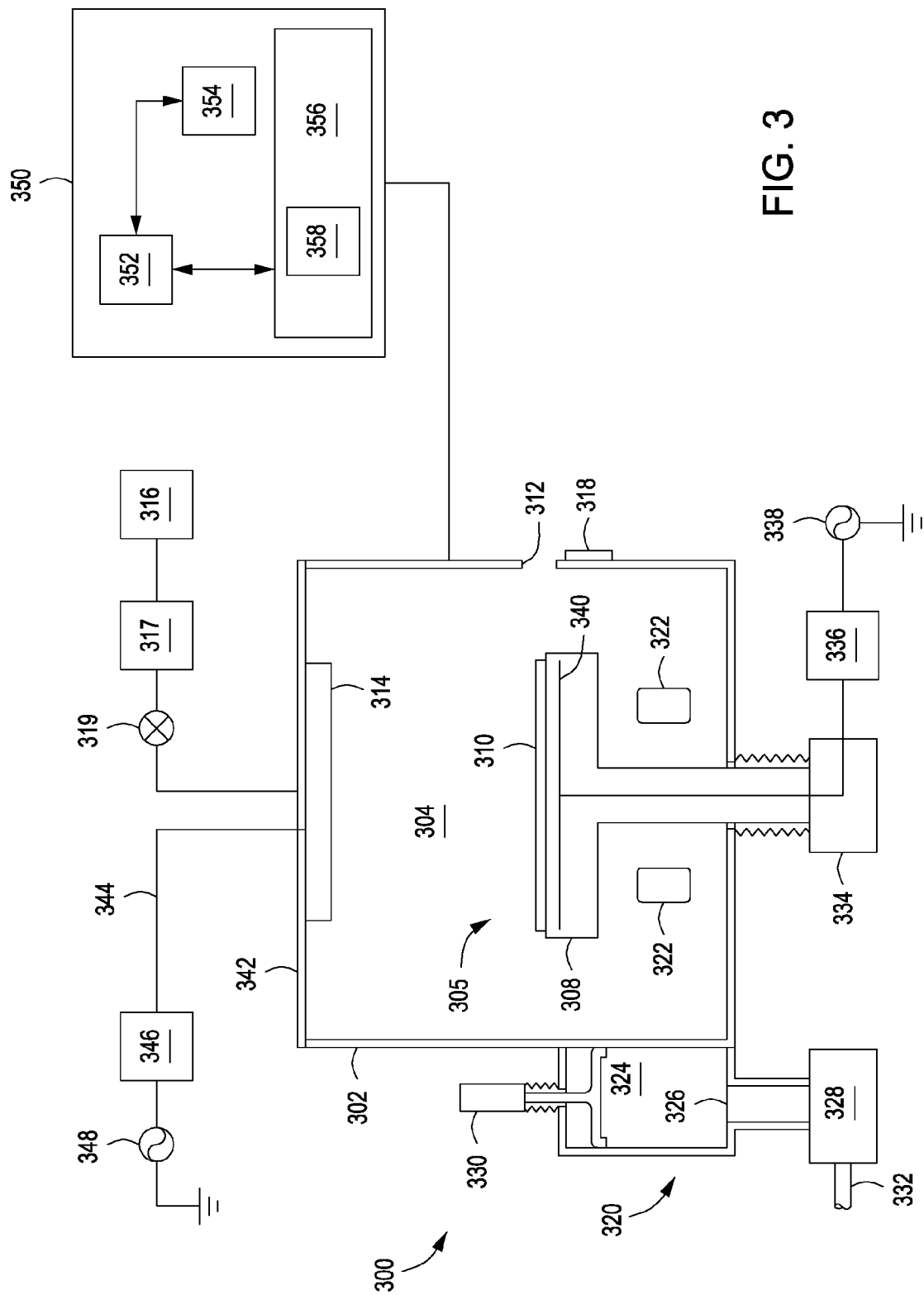
FIG. 3 depicts a process chamber suitable for performing a method of depositing cobalt in features formed on a substrate in accordance with some embodiments of the present disclosure.

FIG. 3 depicts a schematic diagram of an illustrative apparatus 300 of the kind that may be used to practice embodiments of the disclosure as discussed herein. The apparatus 300 may comprise a controller 350 and a process chamber 302 having an exhaust system 320 for removing excess process gases, processing by-products, or the like, from the inner volume 305 of the process chamber 302. Exemplary process chambers may include any of several process chambers configured for chemical vapor deposition (CVD), available from Applied Materials, Inc. of Santa Clara, Calif. Other suitable process chambers from other manufacturers may similarly be used.

The process chamber 302 has an inner volume 305 that may include a processing volume 304. The processing volume 304 may be defined, for example, between a substrate support 308 disposed within the process chamber 302 for supporting a substrate 310 thereupon during processing and one or more gas inlets, such as a showerhead 314 and/or nozzles provided at desired locations. In some embodiments, the substrate support 308 may include a mechanism that retains or supports the substrate 310 on the surface of the substrate support 308, such as an electrostatic chuck, a vacuum chuck, a substrate retaining clamp, or the like (not shown). In some embodiments, the substrate support 308 may include mechanisms for controlling the substrate temperature (such as heating and/or cooling devices, not shown) and/or for controlling the species flux and/or ion energy proximate the substrate surface.

For example, in some embodiments, the substrate support 308 may include an RF bias electrode 340. The RF bias electrode 340 may be coupled to one or more bias power sources (one bias power source 338 shown) through one or more respective matching networks (matching network 336 shown). The one or more bias power sources may be capable of producing up to 1200 W or RF energy at a frequency of about 2 MHz to about 60 MHz, such as at about 2 MHz, or about 13.56 MHz, or about 60 Mhz. In some embodiments, two bias power sources may be provided for coupling RF power through respective matching networks to the RF bias electrode 340 at respective frequencies of about 2 MHz and about 13.56 MHz. The at least one bias power source may provide either continuous or pulsed power. In some embodiments, the bias power source alternatively may be a DC or pulsed DC source.

The substrate 310 may enter the process chamber 302 via an opening 312 in a wall of the process chamber 302. The opening 312 may be selectively sealed via a slit valve 318, or other mechanism for selectively providing access to the interior of the chamber through the opening 312. The substrate support 308 may be coupled to a lift mechanism 334 that may control the position of the substrate support 308 between a lower position (as shown) suitable for transferring substrates into and out of the chamber via the opening 312 and a selectable upper position suitable for processing. The process position may be selected to maximize process uniformity for a particular process. When in at least one of the elevated processing positions, the substrate support 308 may be disposed above the opening 312 to provide a symmetrical processing region.

The one or more gas inlets (e.g., the showerhead 314) may be coupled to a gas supply 316 for providing one or more process gases through a mass flow controller 317 into the processing volume 304 of the process chamber 302. In addition, one or more valves 319 may be provided to control the flow of the one or more process gases. The mass flow controller 317 and one or more valves 319 may be used individually, or in conjunction to provide the process gases at desired flow rates at a constant flow rate, or pulsed (as described above).

Although a showerhead 314 is shown in FIG. 3, additional or alternative gas inlets may be provided such as nozzles or inlets disposed in the ceiling or on the sidewalls of the process chamber 302 or at other locations suitable for providing gases as desired to the process chamber 302, such as the base of the process chamber, the periphery of the substrate support, or the like.

The apparatus 300 may utilize capacitively coupled RF energy for plasma processing. For example, the process chamber 302 may have a ceiling 342 made from dielectric materials and a showerhead 314 that is at least partially conductive to provide an RF electrode (or a separate RF electrode may be provided). The showerhead 314 (or other RF electrode) may be coupled to one or more RF power sources (one RF power source 348 shown) through one or more respective matching networks (matching network 346 shown). The one or more plasma sources may be capable of producing up to about 3,000 W, or in some embodiments, up to about 5,000 W, of RF energy at a frequency of about 2 MHz and/or about 13.56 MHz or a high frequency, such as 27 MHz and/or 60 MHz. The exhaust system 320 generally includes a pumping plenum 324 and one or more conduits that couple the pumping plenum 324 to the inner volume 305 (and generally, the processing volume 304) of the process chamber 302.

A vacuum pump 328 may be coupled to the pumping plenum 324 via a pumping port 326 for pumping out the exhaust gases from the process chamber via one or more exhaust ports (two exhaust ports 322 shown). 302. The vacuum pump 328 may be fluidly coupled to an exhaust outlet 332 for routing the exhaust to appropriate exhaust handling equipment. A valve 330 (such as a gate valve, or the like) may be disposed in the pumping plenum 324 to facilitate control of the flow rate of the exhaust gases in combination with the operation of the vacuum pump 328. Although a z-motion gate valve is shown, any suitable, process compatible valve for controlling the flow of the exhaust may be utilized.

To facilitate control of the process chamber 302 as described above, the controller 350 may be one of any form of general-purpose computer processor that can be used in an industrial setting for controlling various chambers and sub-processors. The memory, or computer-readable medium, 356 of the CPU 352 may be one or more of readily available memory such as random access memory (RAM), read only memory (ROM), floppy disk, hard disk, or any other form of digital storage, local or remote. The support circuits 354 are coupled to the CPU 352 for supporting the processor in a conventional manner. These circuits include cache, power supplies, clock circuits, input/output circuitry and subsystems, and the like.

The inventive methods disclosed herein may generally be stored in the memory 356 as a software routine 358 that, when executed by the CPU 352, causes the process chamber 302 to perform processes of the present disclosure. The software routine 358 may also be stored and/or executed by a second CPU (not shown) that is remotely located from the hardware being controlled by the CPU 352. Some or all of the method of the present disclosure may also be performed in hardware. As such, the disclosure may be implemented in software and executed using a computer system, in hardware as, e.g., an application specific integrated circuit or other type of hardware implementation, or as a combination of software and hardware. The software routine 358 may be executed after the substrate 310 is positioned on the substrate support 308. The software routine 358, when executed by the CPU 352, transforms the general purpose computer into a specific purpose computer (controller) 350 that controls the chamber operation such that the methods disclosed herein are performed.

The disclosure may be practiced using other semiconductor substrate processing systems wherein the processing parameters may be adjusted to achieve acceptable characteristics by those skilled in the art by utilizing the teachings disclosed herein without departing from the spirit of the disclosure.

While the foregoing is directed to embodiments of the present disclosure, other and further embodiments of the disclosure may be devised without departing from the basic scope thereof.

The invention claimed is:

1. A method of depositing a cobalt layer in features of a substrate, comprising:

providing the substrate to a process chamber, the substrate having a feature formed in a first surface and comprising an opening defined by one or more sidewalls, a bottom, and upper corners, wherein a first layer is formed atop the first surface, the one or more sidewalls, the bottom, and the upper corners, wherein a thickness of the first layer proximate the upper corners is greater than the thickness of the first layer at the sidewalls and bottom, wherein the first layer is one of titanium, tantalum, titanium oxide, tantalum oxide, titanium nitride, or tantalum nitride;

exposing the substrate to a plasma formed from a silicon-containing gas to deposit a silicon layer predominantly onto a portion of the first layer that is atop the first surface of the substrate, such that the first layer on the sidewalls and the bottom is not covered by the silicon layer; and depositing the cobalt layer via a chemical vapor deposition process to fill the opening, wherein the silicon layer delays growth of cobalt on the portion of the first layer that is atop the first surface of the substrate relative to a growth of cobalt on the portion of the first layer at the sidewalls and bottom.

2. The method of claim 1, wherein the silicon-containing gas is silane ($SiH_4$).

3. The method of claim 1, wherein exposing the substrate to the plasma further comprises maintaining a process chamber temperature of about 100 degrees Celsius to about 500 degrees Celsius.

4. The method of claim 1, wherein exposing the substrate to the plasma further comprises maintaining a process chamber pressure of about 0.5 Torr to about 50 Torr.

5. The method of claim 1, wherein exposing the substrate to the plasma further comprises exposing the substrate to the plasma for about 5 seconds to about 200 seconds.

6. The method of claim 1, further comprising, applying a bias power to the substrate from a bias power source coupled to a RF bias electrode disposed within a substrate support while exposing the first layer to the plasma.

7. The method of claim 1, wherein the cobalt layer is deposited at a faster rate onto the first layer formed on the sidewalls and the bottom of the opening than on the portion of the first layer that is atop the first surface of the substrate.

8. The method of claim 1, wherein exposing the substrate to the plasma further comprises providing RF energy to the silicon-containing gas to form the plasma.

9. The method of claim 1, wherein the silicon layer has a thickness of about 1 angstrom to about 25 angstroms.

10. The method of claim 1, wherein a width of the opening proximate the upper corners is less than the width of the opening proximate the bottom due to the thickness of the first layer proximate the upper corners relative to the thickness of the first layer at the sidewalls and bottom.

11. A method of depositing a cobalt layer in features of a substrate, comprising:

providing the substrate to a process chamber, the substrate having a feature formed in a first surface and comprising an opening defined by one or more sidewalls, a bottom, and upper corners, wherein a first layer is formed atop the first surface, the one or more sidewalls, the bottom, and the upper corners, wherein a thickness of the first layer proximate the upper corners is greater than the thickness of the first layer at the sidewalls and bottom, wherein the first layer is one of titanium, tantalum, titanium oxide, tantalum oxide, titanium nitride, or tantalum nitride;

exposing the substrate to a plasma formed from a silicon-containing gas to deposit a silicon layer predominantly onto a portion of the first layer that is atop the first surface of the substrate such that the first layer on the sidewalls and the bottom is not covered by the silicon layer; wherein the process chamber has a temperature of about 100 degrees Celsius to about 500 degrees Celsius and a pressure of about 0.5 Torr to about 50 Torr, and wherein the substrate is exposed to the plasma for about 5 seconds to about 200 seconds;

applying a bias power to the substrate from a bias power source coupled to a RF bias electrode disposed within a substrate support while exposing the first layer to the plasma; and depositing the cobalt layer via a chemical vapor deposition process to fill the opening, wherein the silicon layer delays growth of cobalt on the portion of the first layer that is atop the first surface of the substrate relative to a growth of cobalt on the portion of the first layer at the sidewalls and bottom.

* * * * *